United States Patent
McDonald (10) Patent No.: US 11,948,934 B2
(45) Date of Patent: Apr. 2, 2024

(54) METHOD AND APPARATUS FOR INTEGRATING SPARK GAP INTO SEMICONDUCTOR PACKAGING

(71) Applicant: John Othniel McDonald, Reno, NV (US)

(72) Inventor: John Othniel McDonald, Reno, NV (US)

( * ) Notice: Subject to any disclaimer, the term of this patent is extended or adjusted under 35 U.S.C. 154(b) by 0 days.

(21) Appl. No.: 17/842,768

(22) Filed: Jun. 16, 2022

(65) Prior Publication Data
US 2023/0411380 A1    Dec. 21, 2023

(51) Int. Cl.
*H01T 21/00* (2006.01)
*H01L 27/02* (2006.01)
*H01T 4/08* (2006.01)

(52) U.S. Cl.
CPC ............ *H01L 27/0248* (2013.01); *H01T 4/08* (2013.01); *H01T 21/00* (2013.01)

(58) Field of Classification Search
CPC ... H01T 4/00–16; H01T 1/22; H01T 2/00–02; H01L 27/0248; H01L 27/0288; H01L 33/486; H01L 33/62
See application file for complete search history.

(56) References Cited

U.S. PATENT DOCUMENTS

| | | | |
|---|---|---|---|
| 6,191,928 B1* | 2/2001 | Rector | H01H 69/022 361/111 |
| 6,215,251 B1* | 4/2001 | Orchard-Webb | H01T 4/08 315/209 M |
| 2014/0126102 A1* | 5/2014 | Sumi | H05K 1/026 427/78 |
| 2016/0105947 A1* | 4/2016 | Suzuki | H01C 7/105 361/220 |
| 2016/0105948 A1* | 4/2016 | Okamoto | B22F 3/10 419/10 |

* cited by examiner

*Primary Examiner* — Bryan R Perez
(74) *Attorney, Agent, or Firm* — Prorok Patents (57) ABSTRACT

The present invention is a spark gap protection capable of integrating into multiple layer semiconductor substrate packaging. The initial gap in the spark gap is solid and it can be converted into air, meaning gaseous, and the air gap is achieved by having the gap initially be filled with a solid and then running a voltage through the spark gap so that the gap explodes and the solid is replaced by an air cavity.

17 Claims, 7 Drawing Sheets

METHOD AND APPARATUS FOR INTEGRATING SPARK GAP INTO SEMICONDUCTOR PACKAGING

REFERENCE TO A "MICROFICHE APPENDIX"

Not Applicable

BACKGROUND OF THE INVENTION

In general, the field of the present invention relates to semiconductors, and in particular, it relates to electrostatic discharge protection for semiconductors.

In semiconductors, it is important to provide protection to prevent the semiconductor circuit from being damaged by electrostatic discharge (ESD or Spark). Electrostatic Discharge occurs when the voltage difference between two nodes exceeds the dielectric breakdown of the insulating material between the two nodes. Electrostatic buildup, which leads to electrostatic discharge, which is often generated in normal manufacturing and operational environments and is thus something that semiconductors must be designed to handle. As semiconductors get smaller, the potential impact of ESD increases.

One-way ESD can damage circuits is by creating blowouts that leave behind a hole in the circuit. This occurs when the voltage discharged during the ESD event exceeds the voltage breakdown threshold of the material to a high enough degree that the material explodes.

There are two main sources of ESD that a semiconductor is designed to protect against. The first source is from humans who may touch the semiconductor and cause an ESD event. To protect against this source of ESD the semiconductor is designed to protect against a charge under the JED EC 22-A114-B standard which will model an ESD event from a human source, otherwise known as the human body model (HBM). Another source of ESD comes from metal-to-metal contact that may occur during manufacturing commonly modeled in the industry as a charged device model (CDM). Semiconductor Integrated Circuits (ICs) are designed to protect against both HBM and COM. There are various industry-standard protection levels that depend on the application's environmental requirements. The most common HBM protection level is 2 kV for ICs.

To protect a semiconductor IC there are a number of methods, the two most commonly used are 1) a diode from a pin to the IC's ground or power being used to shunt the ESD current off the IC die along an electrical path rated to support the ESD event. 2) A MOSFET switch that is turned on by the ESD event connecting the pin to the IC's ground or power being used again to shunt the ESD current off the IC die along an electrical path rated to support the ESD event. These ESD protective circuits consume IC die area and in some cases are a significant contributor of the cost of the IC. Thus, ESD solutions that consume less die area or provide higher ESD ratings for the same die area may be economically beneficial.

Spark gap devices are another way to protect circuits simply by placing a portion of the circuit to be protected close to a ground point at a location where little permanent damage will occur in the event of ESD. Spark gaps are widely used but are rarely found on the surface of ICs because the spark generated would blast a hole into nearby and the necessary keep out region would be costly to implement.

However, spark gaps are intrinsically simple, reliable, and usually inexpensive and therefore many attempts have been made to incorporate spark gaps into semiconductor packaging where the spark gap is far enough away from sensitive circuits, yet still close enough to provide excellent ESD protection. These efforts have not exited the R&D phase due to:

1. manufacturing tolerances required to generate spark gaps that will spark at a low enough voltage to protect the fine and sensitive silicon integrated circuit embedded in the same package. Cost competitive mainstream lead frame and substrate-based packaging technologies could not generate a gap size small enough to protect the silicon circuit.
2. Once the spark gap has blown in an ESD event, the next ESD event will be triggered at a different voltage level due to the epoxy plastic being degraded and replaced with various gasses which have a different ESD breakdown voltage.
3. Copper based spark gap electrodes are excellent conductors but the metal is soft and degrades with multiple ESD events including but not limited to free floating Cu ions which can greatly influence the spark gap performance.

The following United States patents and patent publications are incorporated in full by reference:

US 20210143111 A1: Package spark gap structure invented by Aleksandar Aleksov, Feras Eid, Johanna M. Swan, Adel A. Elsherbini, and Veronica Aleman Strong US 20170320726 A1: MEMS Package invented by Markus Leitgeb and Nick Renaud-Bezot U.S. Ser. No. 11/296,040 B2: Electrostatic discharge protection in integrated circuits invented by Adel A. Elsherbini; Feras Eid; Johanna M. Swan; Aleksandar Aleksov; and Veronica Aleman Strong US 20180190556 A1: Methods and apparatus for spark gap devices within integrated circuits invented by Barry Jon Male; Steve Kummerl; Robert Alan Neidorff; and Benjamin Stassen Cook U.S. Pat. No. 9,380,688 B1: Air gap electrostatic discharge structure for high speed circuits invented by Kai D. Feng; Yang Liu; Dongbing Shao; and Zheng Xu U.S. Ser. No. 11/112,436 B2: Spark gap structures for detection and protection against electrical overstress events invented by David J. Clarke; Stephen Denis Heffernan; Nijun Wei; Alan J. O'Donnell; Patrick Martin McGuinness; Shaun Bradley; Edward John Coyne; David Aherne; and David M. Boland U.S. Ser. No. 11/289,431 B2: Electrostatic discharge protection in integrated circuits using materials with optically controlled electrical conductivity invented by Feras Eid; Veronica Aleman Strong; Aleksandar Aleksov; Adel A. Elsherbini; and Johanna M. Swan U.S. Pat. No. 3,298,306 A: Electro-explosive device invented by Rolland M Purdy U.S. Pat. No. 3,564,682 A: Method of making a spark gap invented by Joseph J Carroll Jr; and Ferdinand Arocchi U.S. Pat. No. 5,552,951 A: Semiconductor package electrostatic discharge damage protection invented by Nicholas F. Pasch and William Gascoyne U.S. Pat. No. 6,355,958 B1: Spark gap for hermetically packaged integrated circuits invented by Jonathan Harry Orchard-Webb U.S. Pat. No. 6,323,599 B1: Vertical spark gap for microelectric circuits invented by Jonathan Harry Orchard-Webb U.S. Pat. No. 7,349,189 B2: Electrical surge protection using in-package gas discharge system invented by James Michael Hopkins US 20110149452 A1: Surface mount spark gap invented by David Scott Whitefield and Kenneth Warren U.S. Pat. No. 8,999,835 B2: Method and structure of monolithically integrated ESD supperssion device invented by Xiao (Charles) Yang U.S. Pat. No. 6,628,498 B2: Integrated electrostatic discharge and overcurrent device invented by Whitney Steven J.; Maercklein Nate; Deblieck Rob; and Davidson Scott U.S. Pat. No. 6,215,251B1: Spark gap for high voltage integrated circuit electrostatic discharge protection invented by Jonathan Harry Orchard-Webb U.S. Pat. No. 7,508,644B2: Spark gap apparatus and method for electrostatic discharge protection invented by Tim O. Cheung and Douglas Edgar Fregin U.S. Pat. No. 5,969,924A: Spark gap for overcoated printed circuit boards invented by Robert H. Noble U.S. Pat. No. 5,933,307A: Printed circuit board spark gap invented by Charles E. West The following foreign patent publications are incorporated in full by reference FR2507402A1: Gas filled spark gap overvoltage protector—uses low pressure gas filled cylinder contg. two electrodes and moulded in dual-in-line epoxy plastics package invented by Francois Guichard WO2009098553A1: Embedded spark gap invented by Idris Omerovic The following study is incorporated in full by reference Rodriguez-Sema, J. M., Albarracin-Sanchez, R., Dong, M., & Ren, M. (2020). Computer simulation of partial discharges in voids inside epoxy resins using three-capacitance and analytical models. Polymers, 12(1), 77.

BRIEF SUMMARY OF THE CURRENT INVENTION

The preferred embodiments of the present invention comprise a spark gap wherein there are two electrodes spaced 12 microns apart or less, and the gap between them is filled with a solid such as epoxy plastic with a glass bead filling as embodied in semiconductor industry standard Ajinomoto Build Up film. One electrode is connected to the integrated circuit's external input or output port and the other electrode is connected to the IC's ground or power.

For low impedance, the electrodes may be electroplated copper which is excellent for providing a preferential path for an ESD event. However, copper is soft and degrades in such an ESD event and thus in the preferred embodiment of the invention, the copper is coated in either Nickel, Nickel Phosphorus, or an alloy of Nickel Iron all of which are much harder than copper and leave few metal ions floating in the gaseous atmosphere near the electrodes shortly before and after the ESD event. Ni, NiP, and NiFe are all metals widely used in the industry with well known safety, environmental, and performance standards.

In a preferred embodiment of the invention, the glass filled epoxy plastic is able to support high resolution electroplated metal currently with metal to metal spacing down to about Sum with the preferred embodiment around 12 um.

In the preferred embodiment, each sensitive circuit to be protected may be protected by more than one spark gap, such that if a spark gap degrades (or widens) after an ESD event another "fresh" spark gap still has nearly the identical distance as the original spark gap.

In the preferred embodiment because the multilayer substrate is built incorporating both the epoxy plastic and the spark gaps before the IC is attached for final assembly. The spark gaps can be tuned by generating a spark that creates a new gap and surrounding atmosphere at a known and measured voltage. An additional spark can be generated if the first spark fails to achieve the desired result. This is not possible with a standard lead frame type of IC because the sensitive silicon circuit is attached before the epoxy plastic is molded around it. This technique is also not effective for more common build up films that do not have a high level of glass filler. The ability to pre-spark the package is one way to allow for guaranteed performance which is necessary given the small manufacturing tolerances required.

However, in the preferred embodiment of the invention, the epoxy plastic has a breakdown voltage threshold of approximately 30,000 volts per inch which will vary according to the exact formulation of the epoxy plastic. When a strong enough ESD event occurs, the solid epoxy plastic between the two electrodes explodes. This replaces the epoxy plastic in the gap between electrodes with a gas-based gap which can further lower the breakdown voltage of the gap. Because the gap is epoxy plastic-based, the spark gap can be incorporated into multi-level semiconductor substrate packaging and the value of the voltage necessary to trigger an ESD event can be tuned. For example, an epoxy plastic with a breakdown at 900 volts at 12 microns can be triggered on purpose while unattached to the sensitive silicon circuit. The resulting explosion leaves behind an air gap between the two electrodes which, for example, now has a voltage breakdown of approximately 300 volts. In this example, the spark gap can now protect the semiconductor IC against ESD events with voltages of 300 or higher which is about 600 volts lower than the epoxy plastic that originally filled the gap. After or by the explosion, the air hole may be filled with air, carbon dioxide, or other gases that form as a result of the spark reaction.

The preferred embodiment of the present invention comprises a spark gap with two electrodes 12 microns or less apart. However, in alternate embodiments, as need or purpose may dictate, the gap between the electrodes may be larger. One such factor that may increase the needed size is the severity of an ESD explosion that the gap is designed to accommodate. However, as the goal is to reduce the voltage needed to shunt the spark, a smaller gap has a lower breakdown voltage and is usually preferred.

In a preferred embodiment of the invention, the gap between the electrodes is filled with epoxy plastic. In one preferred embodiment of the invention, the epoxy plastic has a tuned low breakdown voltage, for example, approximately 360 volts at 12 microns. This allows the spark gap to be used as an ESD protection device, thus reducing the ESD voltage the target IC is subjected to. This is important because the semiconductor IC is made to handle any voltage below the threshold of protection elements such as power switches and diodes. By lowering the ESD voltage on the inputs of the IC, the IC die size can be reduced due to less ESD protection required.

When epoxy plastic explodes, the size of the air hole left behind tends to be in the micron range. Thus, to keep the hole within the confines of the spark gap the electrodes can be shaped, reinforced by plating, or both. In the preferred embodiments of the invention, the electrodes forming the gap have a triangle shape with a point facing the gap or in the alternative are rounded for more robustness. A rounded shape will be able to survive more ESD events intact whereas a triangle shape may be better at directing the ESD event. The electrodes may be copper or copper plated nickel, nickel iron, or nickel phosphorus for less metallic damage after an ESD event.

The use of copper gives the electrodes low impedance, and to further increase the strength of the electrodes they may be plated with nickel, a steel alloy, titanium, or material with similar properties. Increasing the surface strength of the electrodes gives the electrodes better survivability across multiple ESD events. This is important as the electrodes can be melted by significant ESD events or be damaged by the exploding gap material.

There may be more than one electrode pair per spark gap. An ESD event will normally only affect one electrode pair in the spark gap. So, if one pair of electrodes is damaged the next ESD event will spark across the next electrode pair in the spark gap. This allows for at least one ESD event per electrode pair in the spark gap. This is a simple and low-cost technique to gain protection for multiple ESD events. Further, by using copper, and especially by using plated copper, the electrodes are less susceptible to damage. So, multiple ESD events can occur per each electrode pair in the spark gap. In theory, this allows for the spark gap to protect the semiconductor IC from multiple ESD events.

In part due to the use of epoxy plastic, the preferred embodiment of the present invention is capable of incorporation directly into multi-layer semiconductor substrate packaging. The incorporation of the spark gap into the multi-level semiconductor substrate packaging allows for a significantly reduced die size and lowers the cost of the semiconductor. While the electrode design allows for repeated use of the spark gap. Further, because of the low voltage breakdown threshold in the spark gap, the degree of ESD protection is high—the spark gap is able to protect against lower voltage ESD. Lowering the voltage allows for the spark gap to be used in smaller, more sensitive circuits. The lower voltage also reduces the burden on a circuit engineer to build a circuit that can handle higher voltages.

Finally, by using materials that are commonly found in semiconductor packaging the spark gaps can be built on the same layers for near zero additional cost as other substrate circuits. For example, a substrate that incorporates both copper traces and an inductor using magnetic metals can also build robust spark gaps for no additional cost as the layers and materials are already incorporated.

DETAILED DESCRIPTION

In the present invention, a spark gap is embedded in semiconductor epoxy plastic. An initial voltage discharge event, such as an electrostatic discharge (ESD), will cause the gap material of the spark gap to explode. The electrodes of the spark gap are made strong enough to survive an explosion. The exploded material of the spark gap will leave a combusted cavity that is roughly shaped. The combusted cavity can serve as what can be referred to as an air or gas gap as it will be filled with gas from the explosion or environment or both. The survival of the electrodes and the creation of a combusted cavity allows the spark gap to handle multiple ESD events.

Figure 1A:
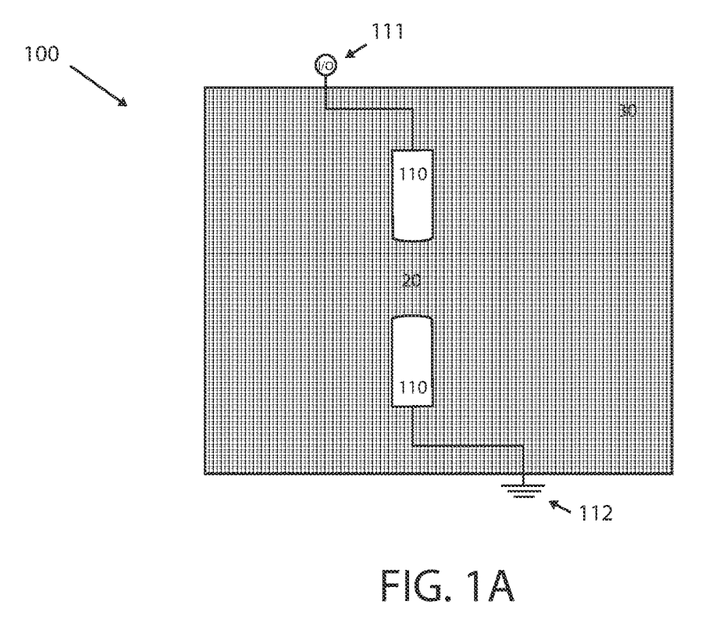
FIG. 1A Is a top-down cross-sectional view of a single electrode pair embodiment with a epoxy plastic filled gap, FIG. 1B Is a side cross-sectional view of a single electrode pair embodiment with a epoxy plastic filled gap.
Figure 1B:
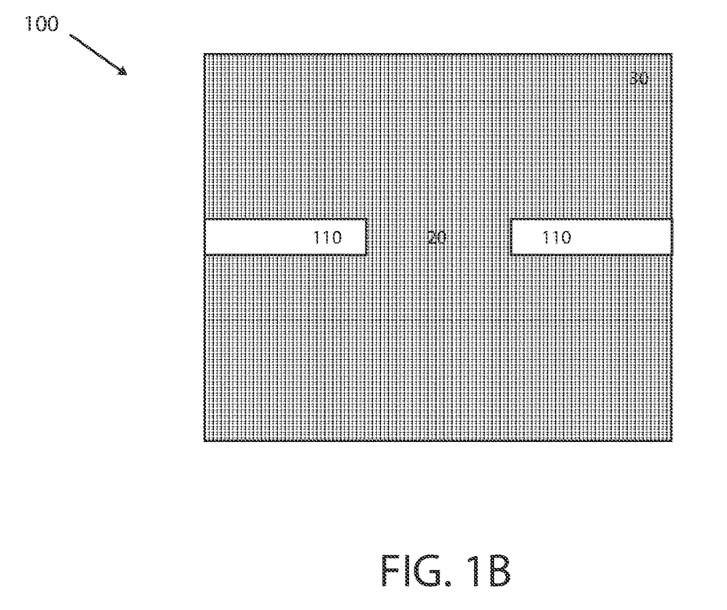

FIG. 1A and FIG. 1B depict an elegant embodiment of the present invention: a spark gap apparatus 100 which is a spark gap comprised of at least two electrodes 10, one electrode is connected to an I/O 111 and the other electrode is connected to a ground 112, between the electrodes there is a gap 2.0 that is twelve microns or less across, and a semiconductor packaging epoxy plastic 30 encapsulates the spark gap. This forms a spark gap completely embedded in a semiconductor packaging epoxy plastic 30. There is no cavity—the gap between the electrodes is a solid epoxy plastic. The spark gap is able to be incorporated into semiconductor packages on the leading edge of minimization as well as the leading edge of multi-layer packaging as apparatus 100 also occurs on a micron-scale and incorporates the epoxy plastic packaging. Further due to their location connecting electrodes to the IC is a simple procedure.

FIG. 1A shows a top-down cross-section of the spark gap and FIG. 18 shows a side-view cross-section of the same spark gap. Therefore, it can be seen that the spark gap 100 is entirely encapsulated by semiconductor packaging epoxy plastic. This gives the embodiment its elegance, as it is able to integrate into a wide variety of semiconductor packages cheaply and quickly. The invention is highly compatible with Ajinomoto epoxy plastics, and the preferred embodiment of the present invention incorporates black build-up film as the epoxy plastic 30. However, a wide variety of epoxy plastics may be utilized by the present invention.

Figure 2:
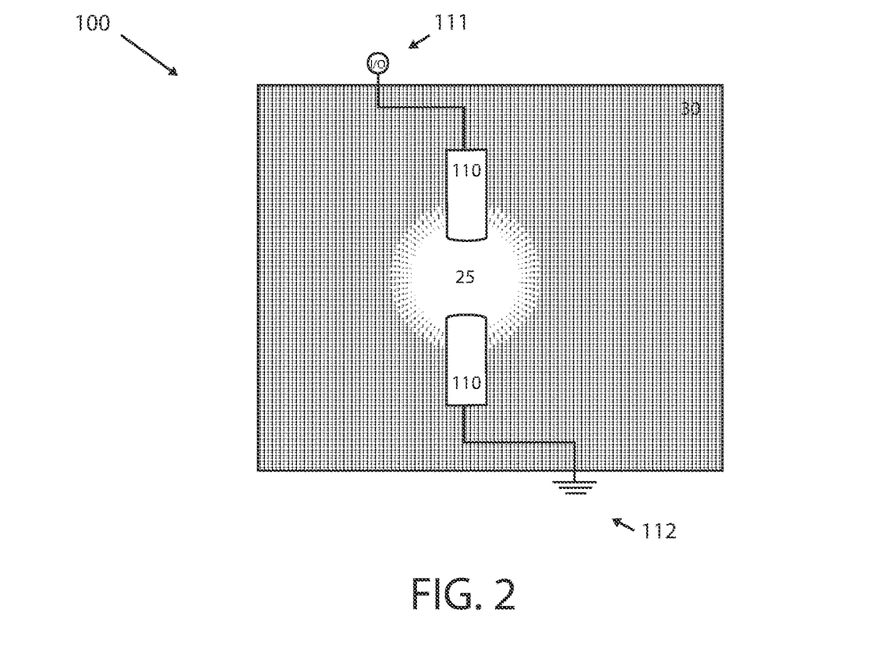
FIG. 2 Is a top-down cross-sectional view of a single electrode pair embodiment with a combusted cavity air gap.

When a high voltage event, for example, an electrostatic discharge, occurs a spark is generated across the gap 20 and that spark can violently explode any epoxy plastic 30 in gap 20 leaving a gas gap as shown in FIG. 2. The gas gap can be referred to by three names, combusted cavity, gas gap, and air gap. After or by the explosion, the combusted cavity may be filled with air, carbon dioxide, or other gases that form as a result of the spark reaction. By controlling the properties of the electrodes 10 and the epoxy plastic 30 the creation of a gas gap can in this manner can be beneficial and be tuned to provide a specific level of ESD voltage protection. The benefits include a low-cost, tunable, and simple gas gap that can handle multiple discharge events. Further, in embodiments with rows of electrode pairs, the order of the spark gap discharges can be controlled.

Packaging epoxy plastics can have different breakdown voltages as there are a wide variety of packing epoxy plastics possible so there are a wide range of epoxy plastic breakdown voltages available.

In preferred embodiment of the invention, an epoxy plastic, for example, an epoxy plastic with a breakdown at 900 volts at 12 microns, an ESD event with a high enough voltage to cause the breakdown and to explode the epoxy plastic may be triggered on purpose before the spark gap is to be used. The resulting explosion leaves behind an air gap between the two electrodes which, for example, has a voltage breakdown of approximately 300 volts. In this example, the spark gap can now protect the semiconductor IC that will be later attached to the substrate against ESD events with voltages of 300 or higher which is about 600 volts lower than the epoxy plastic that originally filled the gap.

Figure 4:
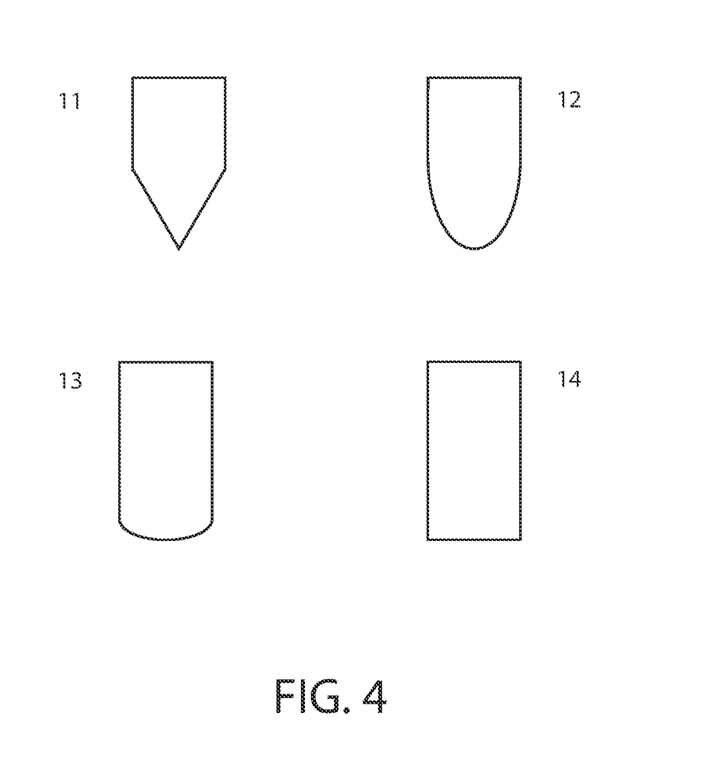
FIG. 4 Is a top-down view of a variety of electrode head shapes.

With reference to FIG. 2 it can be seen that the combusted cavity gap 25 may reach the ends of the electrodes 10. There are several design elements that are taken in various embodiments of the present invention to improve the survivability of the electrodes 10, The first design element is the shape of the electrode in FIG. 2 the electrode comes to a rounded point. The rounded point is more resistant to the explosion that occurred in the gap 25, but still provides some directional influence on the spark. Other electrode shapes can be implemented, and several are shown in FIG. 4 where 11 is a sharp-angled point, 12 is a rounded angle, 13 is a rounded electrode, and 14 is a flat surface. More shapes be made, and the angles and angle softness may vary among embodiments.

Figure 5:
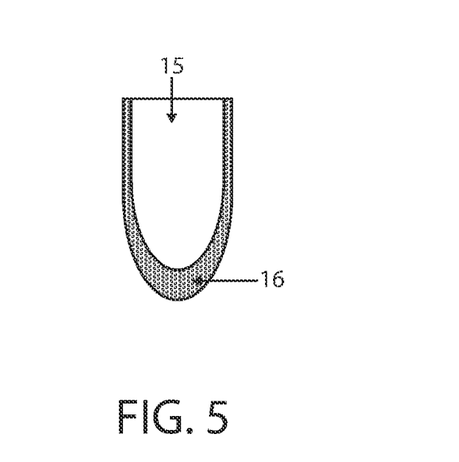
FIG. 5 Is a top-down cross-sectional view of a single plated electrode.

A second design element is the material of the electrodes 10. The electrodes 10 are copper. Copper is preferred used for its lov, 1 impedance, The resistance of the electrode to damage can be further controlled, by a third design element: plating the electrodes 10, which is shown in FIG. 5 where 15 is the initial electrode material and 16 is the plated material. The electrodes may be plated with a stronger metal including titanium, steel alloy, or nickel. (A copper electrode is especially suited for being plated with nickel as nickel will prevent copper ions from interacting with the gap.) Plating helps to ensure that the spark gap can operate over multiple ESD events even as the epoxy plastic of the gap material is blown out leaving a combusted cavity gap 25 as shown in FIG. 2. The plating of the electrode can also enable more angled electrode shapes by adding structural strength to the electrode with a weaker shape such as a thin and sharp point.

Further, when epoxy plastic explodes, the size of the combusted cavity left behind tends to be in the micron range. Thus, using metal electrodes, shaping the electrodes, reinforcing them by plating, or doing all three to the electrodes, helps keep the combusted cavity within the confines of the spark gap.

The design of the electrodes and the placement of the electrodes in the semiconductor epoxy plastic enable a spark gap lo handle higher voltages than otherwise and survive multiple discharge events while being small enough to be relevant as semiconductor technology continues to miniaturize as well as being backward compatible into a wide variety of semiconductor packaging designs and types. The preferred embodiment of the present invention is capable of incorporation directly into multi-layer semiconductor substrate packaging. Because of, but not limited to, the size, ease of manufacturing, level of protection, and location of the spark gap, this invention reduces the required die size and cost of ESD protection while increasing the survivability of the IC over multiple ESD events.

Example Embodiments

Figure 3:
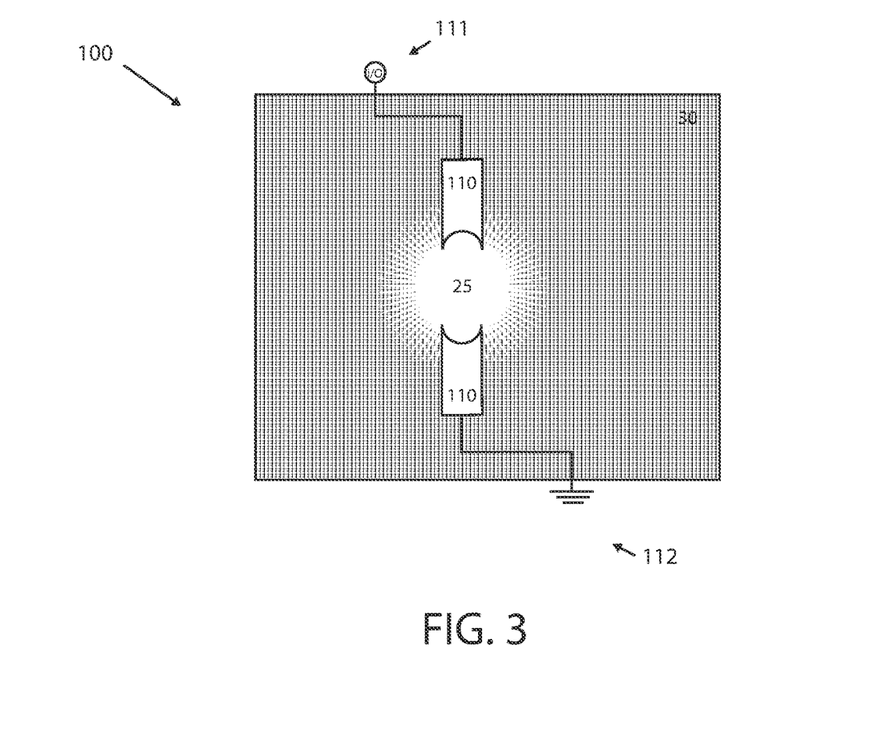
FIG. 3 Is a top-down cross-sectional view of a single electrode pair embodiment with a combusted cavity air gap where the electrodes are heavily damaged.

An elegant embodiment and the stages of its life cycle (the point from when the spark gap apparatus is made to when it is no longer operable) are shown by FIG. 1A, FIG. 2., and FIG. 3. As shown by FIG. 1 the spark gap 100 contains one electrode pair of electrodes 10 and is embedded fully in epoxy plastic at the start of its lifecycle. The second life cycle stage is shown in FIG. 2 and occurs after an initial ESD event. In this stage, a combusted cavity 25 in the epoxy plastic 30 will present the medium that the spark will travel through. The third and final life cycle stage of the spark gap occurs after the electrodes melt or are damaged so that they are no longer operable.

The transition from the first stage to the second stage occurs after an initial discharge event. This event can be triggered by a user or manufacturer of the spark gap on purpose to transition the spark gap to the second stage or it can be left for happenstance in the daily life of the system. A user may wish to transition to the second stage as this will ensure a specific breakdown voltage and enable the spark gap to protect against lower voltages. In the first stage, a partial discharge may occur, and this may delay the transition into the second stage giving the first state the ability to handle multiple discharges. In embodiments where there are multiple electrode pairs each pair will have its own lifecycle, In the second stage, multiple ESD events may occur until the electrodes are melted or damaged in some manner so as to be inoperable. Once inoperable the third stage entered and is shown in FIG. 3 where the electrodes 10 are now heavily damaged. A heavily damaged electrode is one that will no longer take a spark within a voltage threshold to be useful for protecting the device. This transition from a second stage to a third stage is important when considering more sophisticated embodiments, In this elegant embodiment of the invention shown in FIG. 1A—FIG. 3, the electrodes forming the gap may have any of the above discussed shapes, but the rounded angle shape as shown is currently preferred. A rounded angle shape will be able to survive more ESD events than a sharply angled point. In this embodiment, the electrodes may be, but are not limited to copper or nickel. The use of copper or nickel gives the electrodes strength. To further increase the strength of the electrodes they may be plated with nickel, nickel iron alloy, a steel alloy, titanium, or material with similar properties. Many configurations of a single electrode pair may be made without exceeding the scope of the invention.

Figure 6:
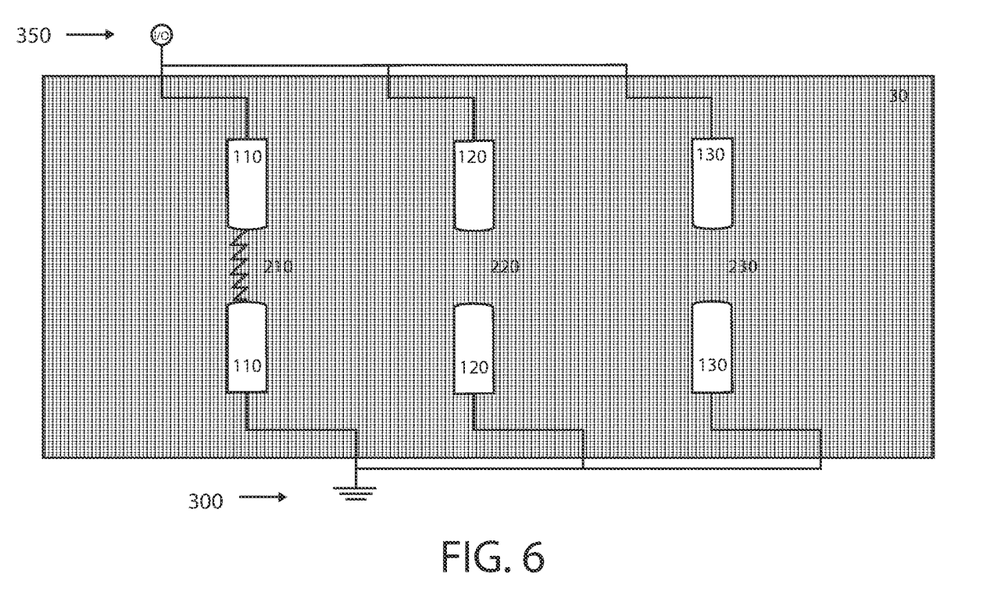
FIG. 6 Is a top-down cross-sectional view of a spark gap with three electrode pairs where the epoxy plastic they are embedded in has a higher breakdown voltage than the gas of the combusted cavity gap as an initial spark is arcing across a gap.
Figure 7:
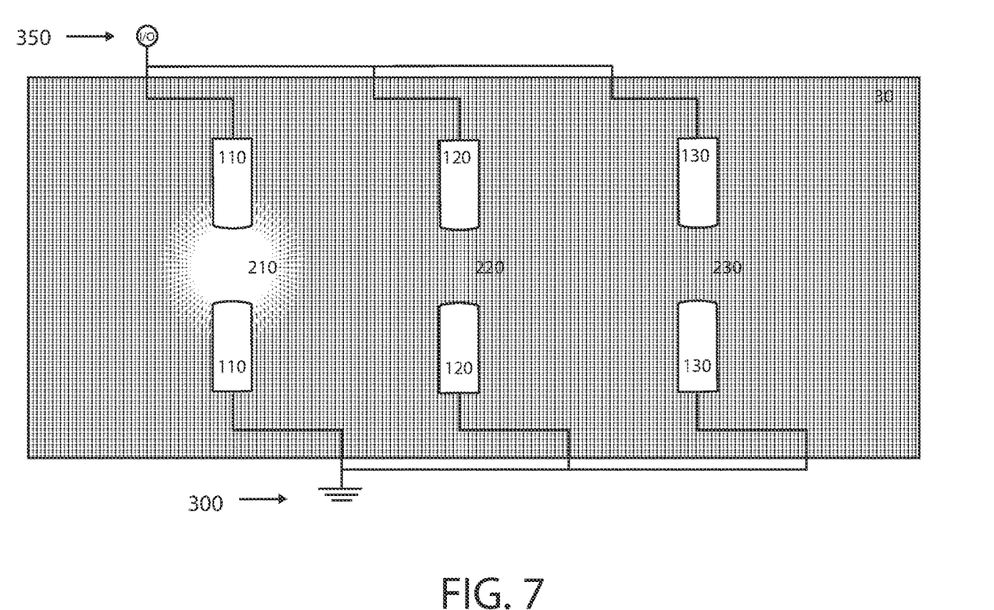
FIG. 7 Is a top-down cross-sectional view of a spark gap with three electrode pairs where the epoxy plastic they are embedded in has a higher breakdown voltage than the gas of the combusted cavity gap with an initial spark turning the gap receiving the initial spark into a gas gap.

Embodiments can include multiple electrode pairs per spark gaps. One such embodiment is shown in FIG. 6, where there are three electrode pairs, electrode pair 110, electrode pair 12.0, and electrode pair 130. Each electrode pair has a gap 210, 22.0, and 230 associated with it and all electrodes connect to either a ground 300 or an input/output 350. The electrode pairs 110, 120, and 130 form a row of electrodes. By incorporating multiple electrode pairs into a single spark gap the longevity of the spark gap is increased without a significant increase in cost. This embodiment is embedded in semiconductor epoxy plastic 30 and all gaps 210, 220, and 230 consist at the stage shown in FIG. 6 as a solid semiconductor epoxy plastic.

In the preferred embodiment, the spark gap is embedded in epoxy plastic thus the first discharge will be over solid epoxy plastic. However, the order in which the electrode pairs discharge across the gap after an initial electrode pair completes the transition to the second stage of the lifecycle is primarily determined by the semiconductor epoxy plastic. When the semiconductor epoxy plastic the gas gap it will run through its life cycle stages before the next electrode pair is triggered. When the semiconductor epoxy plastic has a lower breakdown voltage than air each epoxy plastic electrode will transition into the second stage before the air gap will be utilized.

Figure 8:
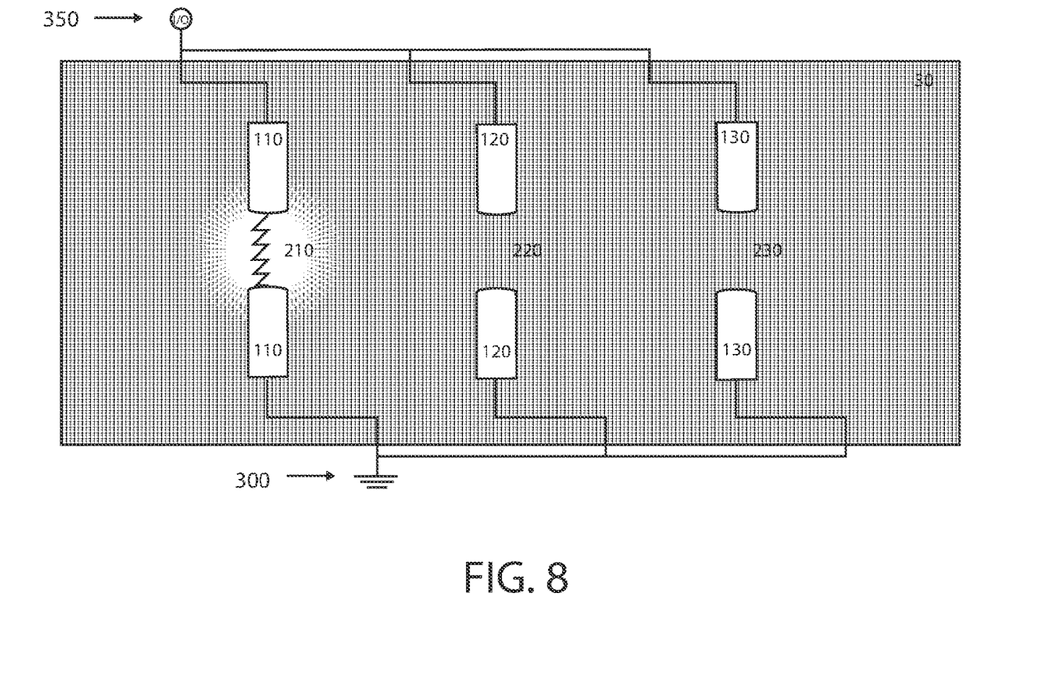
FIG. 8 Is a top-down cross-sectional view of a spark gap with three electrode pairs where the epoxy plastic they are embedded in has a higher breakdown voltage than the gas of the combusted cavity gap with a spark crossing an initial combusted cavity.
Figure 9:
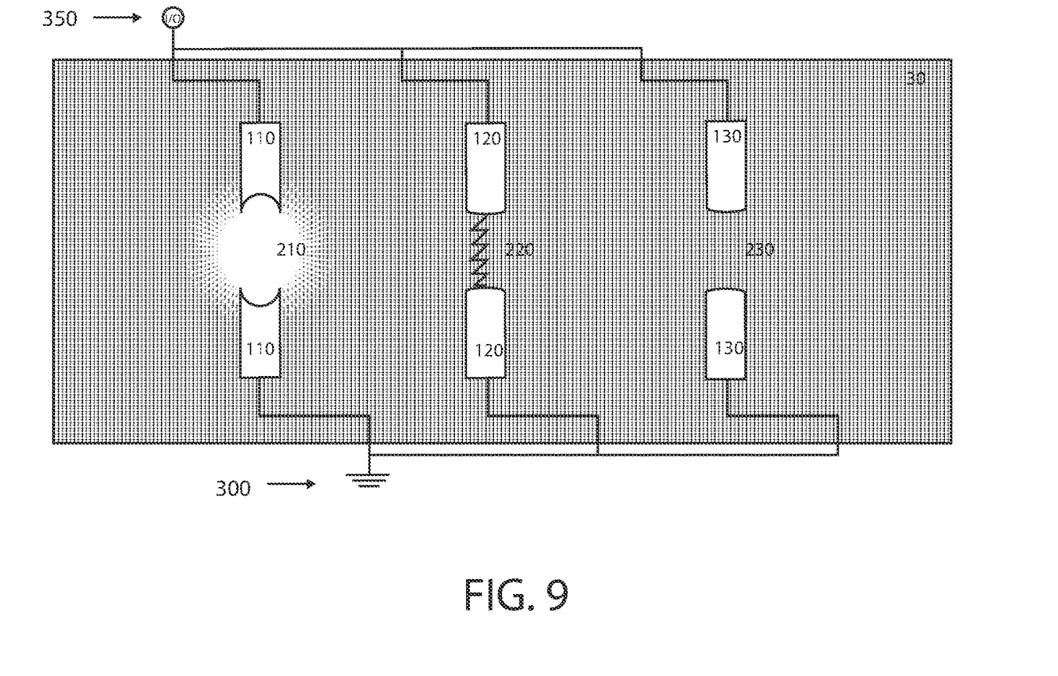
FIG. 9 Is a top-down cross-sectional view of a spark gap with three electrode pairs where the epoxy plastic they are embedded in has a higher breakdown voltage than the gas of the combusted cavity gap with the electrodes of initial cavity broken and a spark crossing a second epoxy plastic filled gap.
Figure 10:
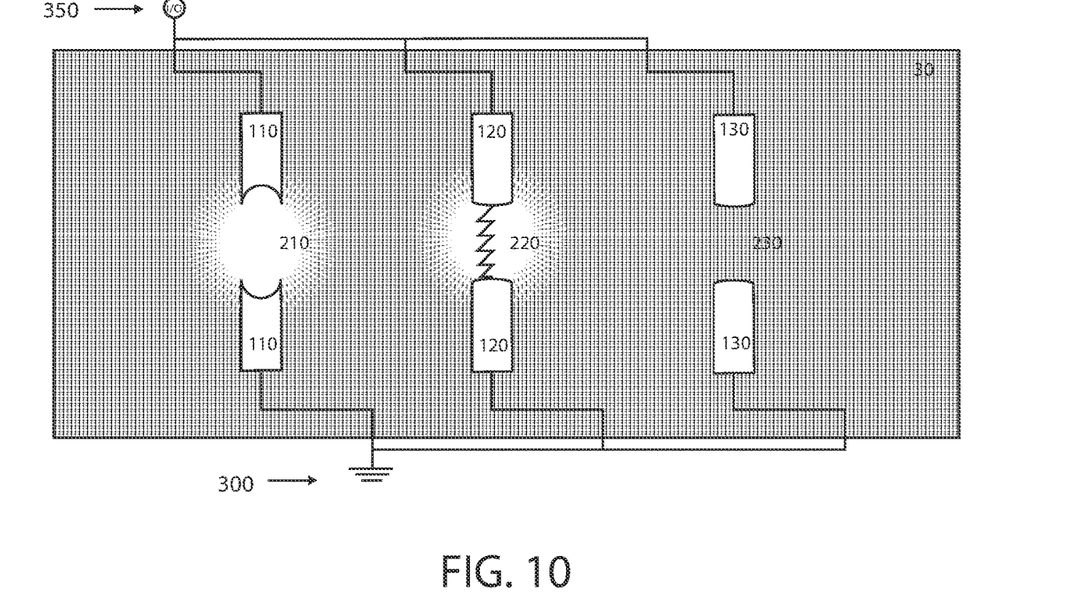
FIG. 10 Is a top-down cross-sectional view of a spark gap with three electrode pairs where the epoxy plastic they are embedded in has a higher breakdown voltage than the gas of the corn busted cavity gap with the second gap now being a combusted cavity and a spark crossing that cavity.
Figure 11:
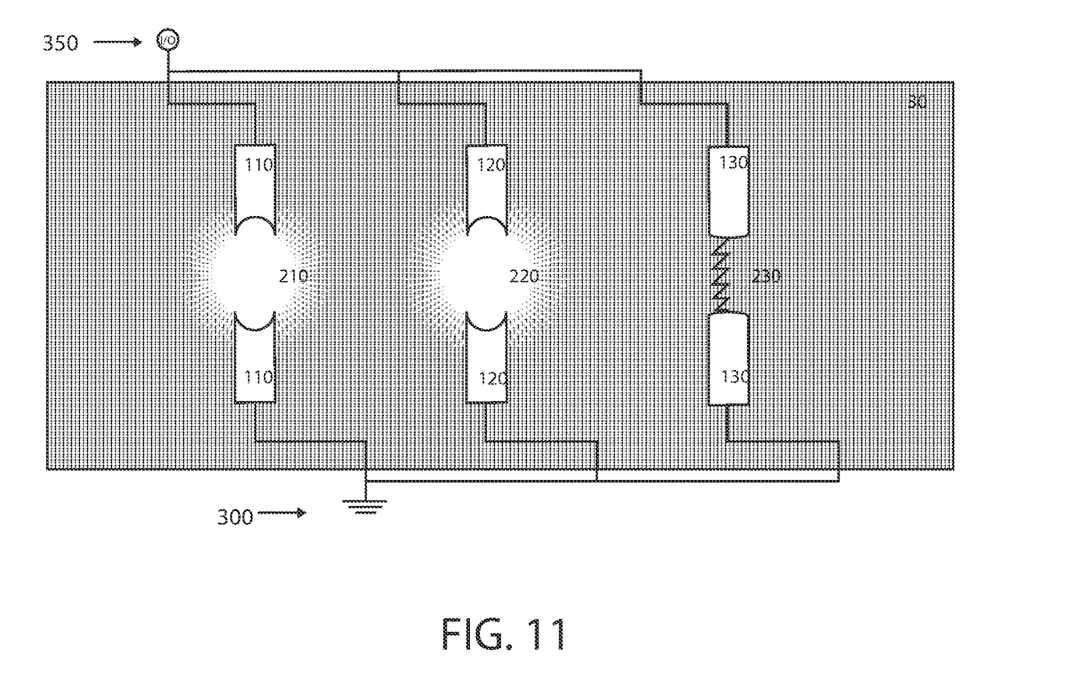
FIG. 11 Is a top-down cross-sectional view of a spark gap with three electrode pairs where the epoxy plastic they are embedded in has a higher breakdown voltage than the gas of the combusted cavity gap with the electrodes of the second gap now being heavily damaged and a spark crossing the last epoxy plastic filled gap.
Figure 12:
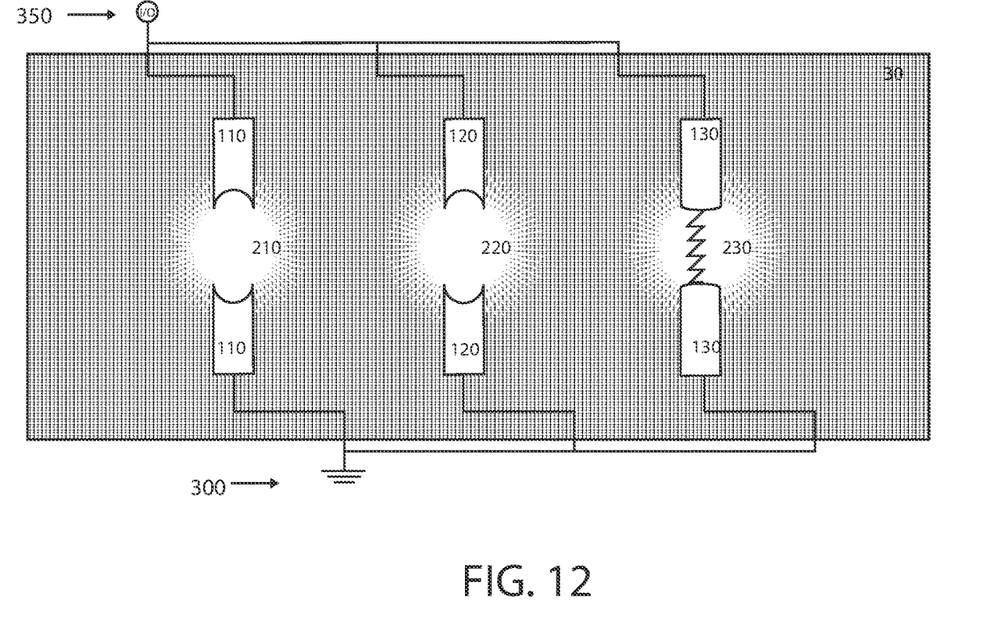
FIG. 12 Is a top-down cross-sectional view of a spark gap with three electrode pairs where the epoxy plastic they are embedded in has a higher breakdown voltage than the gas of the combusted cavity gap with the second gap now being a combusted cavity and a spark crossing that cavity.
Figure 13:
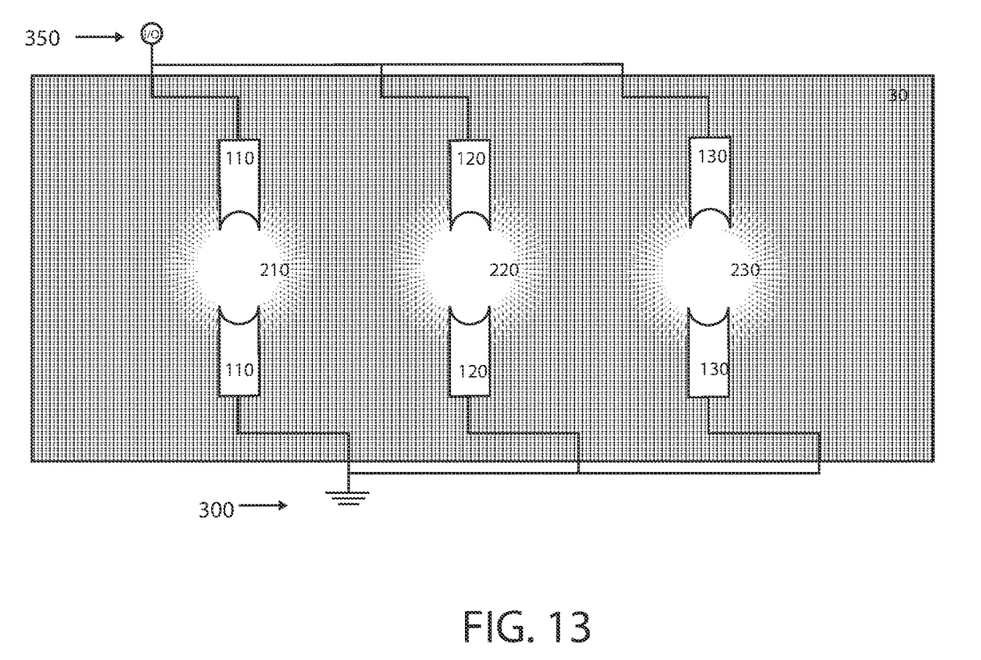
FIG. 13 Is a top-down cross-sectional view of a spark gap with three electrode pairs where the epoxy plastic they are embedded in has a higher breakdown voltage than the gas of the combusted cavity gap with the electrodes of the last gap now being heavily damaged.

In the embodiment denoted by FIG. 6, where the epoxy plastic 30 has a higher breakdown voltage than a potential combustion cavity gap, the first electrode pair to hold a spark will be an electrode pair that has an epoxy plastic gap and this is shown in FIG. 6 as a spark occurs between electrode pair 110. After this spark occurs the next discharge will occur in the combusted cavity 210 as shown by FIG. 8, This air gap 210 is designed to continue to take a plurality of ESD events and it will do so until as shown by FIG. 9 its associated electrode pair 110 becomes damaged and inoperable. At this point a surviving electrode pair having a solid epoxy plastic gap will receive the next ESD event, as shown in FIG. 10, and as such the ESD protection the whole spark gap apparatus offers will be temporarily raised to that of the epoxy plastic. As shown in FIG. 11, the new combustion cavity gap 220 created by the spark in FIG. 10 will receive discharge events. Once the electrode pair receiving the discharge, here 120, has been damaged the new electrode pair, here 130, will receive the spark. The new combustion cavity 130 shown in FIG. 12 will continue to receive the spark until the electrode pair 130 become damaged as shown in FIG. 13. Once the final pair of electrodes is damaged and can no longer receive an ESD event the spark gap will no longer be to protect against such events. Therefore, from FIG. 6-FIG. 13 it can be seen that when the spark gap of the present invention with a plurality of electrode pairs is embedded into a epoxy plastic that has a higher breakdown voltage than air at 12 microns or less that each individual electrode pair is used up before the next one begins to receive ESD events.

In the preferred embodiments the electrode pairs are to be spaced 12 microns or less apart. However, in alternative embodiments they may be spaced greater than 12 microns apart. The distance the electrodes are apart affects the breakdown voltage over the gap, by increasing the distance the electrodes are apart there is an increase in the amount of material in the gap and thus the needed voltage to breakdown the gap is increased.

The electrodes may be created by electroplating and the epoxy plastic placed by ordinary means.

Because of, but not limited to, the size, ease of manufacturing, level of protection, and location of the spark gap, this invention reduces the required die size and cost of ESD protection while increasing the survivability of the IC over multiple ESD events. The drawings and figures show multiple embodiments and are intended to be descriptive of particular embodiments but not limiting with regard to the scope or number, or style of the embodiments of the invention. The invention may incorporate a myriad of styles and particular embodiments. All figures are prototypes and rough drawings: the final products may be more refined by one of skill in the art. Nothing should be construed as critical or essential unless explicitly described as such. Also, the articles "a" and "an" may be understood as "one or more." Where only one item is intended, the term "one" or other similar language is used. Also, the terms "has," "have," "having," or the like are intended to be open-ended terms.

I claim:

1. A spark gap apparatus comprising;
   a first electrode and a second electrode forming an electrode pair that is encapsulated in a semiconductor packaging epoxy plastic with glass bead filling and operationally spaced to form a gap between the first electrode and the second electrode that is 12 microns or less apart;
   where the first electrode electrically connects to a ground and the second electrode electrically connects to an input/output, and
   the spark gap is embedded in a multi-layer epoxy plastic substrate suitable for integrated circuit packaging.

2. The spark gap of claim 1, where in the gap of the spark gap apparatus is a pre-sparked tuned combusted cavity spark gap.

3. The spark gap of claim 2, wherein the gap of at least one of the electrode pairs is a combusted cavity gap.

4. The spark gap of claim 2, wherein the electrodes of the electrode pairs each come to an angular point that points to the electrode they are paired with.

5. The spark gap of claim 2, wherein the electrodes have a rounded shape.

6. The spark gap of claim 2, wherein the electrodes are copper.

7. The spark gap of claim 2, wherein the electrodes are plated with a nickel, nickel phosphorus, an alloy of nickel Iron or a titanium plating.

8. The spark gap of claim 2, where in the spark gap is on the same layers and at least one trace or other embedded components such as inductors, capacitors, resistors.

9. The spark gap apparatus of claim 1, further comprising a plurality of electrode pairs.

10. A method of making a spark gap apparatus comprising; taking a spark gap apparatus comprising; at least one first electrode and at least one second electrode forming at least one electrode pair that is encapsulated in a semiconductor packaging epoxy plastic with glass bead filling and operationally spaced to form a gap between the first electrode and the second electrode that is 12 microns or less apart; where the first electrode electrically connects to a ground and the second electrode electrically connects to an input/output, and the gap is filled with the semiconductor packaging epoxy plastic; creating an initial electrostatic discharge between the first electrode and the second electrode so that the semiconductor packaging epoxy plastic which fills the gap combusts and forms a combusted cavity gap reaching the first electrode and the second electrode.

11. The method of making a spark gap claim 10, wherein the electrodes are plated with a nickel, nickel phosphorus, an alloy of nickel Iron or a titanium plating.

12. The method of claim 10, wherein the spark gap is co-built on the same layers and with the same materials as other traces and other embedded components such as inductors, capacitors, resistors.

13. The method of making a spark gap claim 10, wherein after all of the electrode pair gaps are replaced with a combusted gap at least one future electrostatic event occurs across at least one combusted gap.

14. The method of claim 10, wherein the resulting combusted cavity gap has a tuned frequency.

15. The method of making a spark gap claim 14, wherein the first electrode and the second electrode of the electrode pairs each come to an angular point that points to the electrode they are paired with.

16. The method of making a spark gap claim 14, wherein the first electrode and the second electrode of the electrode pairs have a rounded shape.

17. The method of making a spark gap claim 14, further comprising creating one electrostatic discharge event per electrode pair until the semiconductor packaging epoxy plastic of the gap for every electrode pair is replaced with a combusted cavity gap.

* * * * *